(12) United States Patent
Lee et al.

(10) Patent No.: US 8,724,409 B2
(45) Date of Patent: May 13, 2014

(54) SEMICONDUCTOR INTEGRATED CIRCUIT

(75) Inventors: Kang Seol Lee, Ichon-shi (KR); Jae Hyuk Im, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 326 days.

(21) Appl. No.: 12/947,441

(22) Filed: Nov. 16, 2010

(65) Prior Publication Data

US 2011/0291639 A1 Dec. 1, 2011

(30) Foreign Application Priority Data

May 31, 2010 (KR) ........................ 10-2010-0051356

(51) Int. Cl.
*G11C 7/00* (2006.01)
*G11C 29/00* (2006.01)
*G05F 3/16* (2006.01)
*G05F 3/20* (2006.01)

(52) U.S. Cl.
USPC .......................................... 365/201; 323/313

(58) Field of Classification Search
USPC .......................................... 365/201; 323/313
See application file for complete search history.

(56) References Cited

U.S. PATENT DOCUMENTS

| | | | |
|---|---|---|---|
| 5,596,297 A * | 1/1997 | McClure et al. | 327/538 |
| 6,327,198 B1 * | 12/2001 | Kato et al. | 365/201 |
| 6,333,879 B1 * | 12/2001 | Kato et al. | 365/201 |
| 6,366,111 B1 * | 4/2002 | Kawai | 324/762.02 |
| 6,370,061 B1 * | 4/2002 | Yachareni et al. | 365/185.22 |
| 7,467,339 B2 * | 12/2008 | Tanaka et al. | 714/724 |
| 7,567,470 B2 * | 7/2009 | Mondello et al. | 365/189.09 |
| 7,939,892 B2 * | 5/2011 | Tran et al. | 327/310 |
| 2003/0179618 A1 | 9/2003 | Choi et al. | |
| 2003/0179636 A1 * | 9/2003 | Choi et al. | 365/201 |
| 2004/0042331 A1 * | 3/2004 | Ikehashi et al. | 365/232 |

FOREIGN PATENT DOCUMENTS

| | | |
|---|---|---|
| JP | 2005-180935 | 7/2005 |
| JP | 2008-077814 | 4/2008 |
| KR | 1020080065870 A | 7/2008 |

* cited by examiner

*Primary Examiner* — Jue Zhang

(74) *Attorney, Agent, or Firm* — William Park & Associates Patent Ltd.

(57) ABSTRACT

A semiconductor integrated circuit includes an internal reference voltage generation unit configured to generate an internal reference voltage; a high voltage generation unit configured to pump an external driving voltage based on the internal reference voltage applied from the internal reference voltage generation unit, and generate a high voltage having a specified level; and a reference voltage transfer unit configured to generate a test reference voltage from a reference voltage in a package test mode to correspond to a change in a driving operation of the external driving voltage applied from outside, and monitor and force the internal reference voltage.

11 Claims, 8 Drawing Sheets

_US 8,724,409 B2_

SEMICONDUCTOR INTEGRATED CIRCUIT

CROSS-REFERENCES TO RELATED APPLICATION

The present application claims priority under 35 U.S.C. §119(a) to Korean Application No. 10-2010-0051356, filed on May 31, 2010, in the Korean Intellectual Property Office, which is incorporated herein by reference in its entirety as if set forth in full.

BACKGROUND

1. Technical Field

Various embodiments of the present invention relate to a semiconductor integrated circuit, and more particularly, to a semiconductor integrated circuit that is capable of improving the reliability of a semiconductor integrated chip and related methods.

2. Related Art

Semiconductor integrated circuits have been developed toward high integration, high performance and low power consumption. As the degree of integration of semiconductor integrated circuits is increased, the internal operational voltage of semiconductor integrated chips have decreased accordingly.

To achieve this end, a package test on a chip in a semiconductor integrated circuit should be performed to monitor internal power voltages and force the voltages to target power levels so that the chip may perform normal operations or maintaining normal data.

Meanwhile, in the package test, the loading of a reference voltage (Vref) may be completed earlier than the loading of an external power voltage (VDD) while a power-up sequence is executed, or the reference voltage (Vref) may be applied earlier than the external power voltage (VDD), to an internal voltage terminal to be forced or monitored.

In this case, as the reference voltage having a level higher than that of a normal reference voltage is applied, the internal voltage which should be generated with a preset level may have a level higher than the preset level. As a consequence, the reliability of a semiconductor chip may be degraded which is problematic to the operation of the semiconductor integrated circuit.

SUMMARY

Accordingly, various exemplary embodiments of the invention may provide a semiconductor integrated circuit that is capable of improving the reliability of a chip.

In one embodiment of the present invention, a semiconductor integrated circuit which operates in a package test mode and normal operation mode, the semiconductor integrate circuit includes: an internal reference voltage generation unit configured to generate an internal reference voltage; a high voltage generation unit configured to pump an external driving voltage based on the internal reference voltage applied from the internal reference voltage generation unit, and generate a high voltage having a specified level; and a reference voltage transfer unit configured to receive a reference voltage and, in the package test mode, generate a test reference voltage based on the reference voltage to correspond to a change in a driving operation of the external driving voltage applied from outside, and monitor and force the internal reference voltage.

In another embodiment of the present invention, a semiconductor integrated circuit includes: a reference voltage generation unit configured to generate first and second reference voltages; a mode selection unit configured to activate the first reference voltage in response to a level of a mode select signal applied from outside; and an internal voltage generation block configured to generate a test reference voltage from the first reference voltage in correspondence to a change in a driving operation of an external driving voltage applied from outside in a package test mode, and monitor and force an internal reference voltage.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
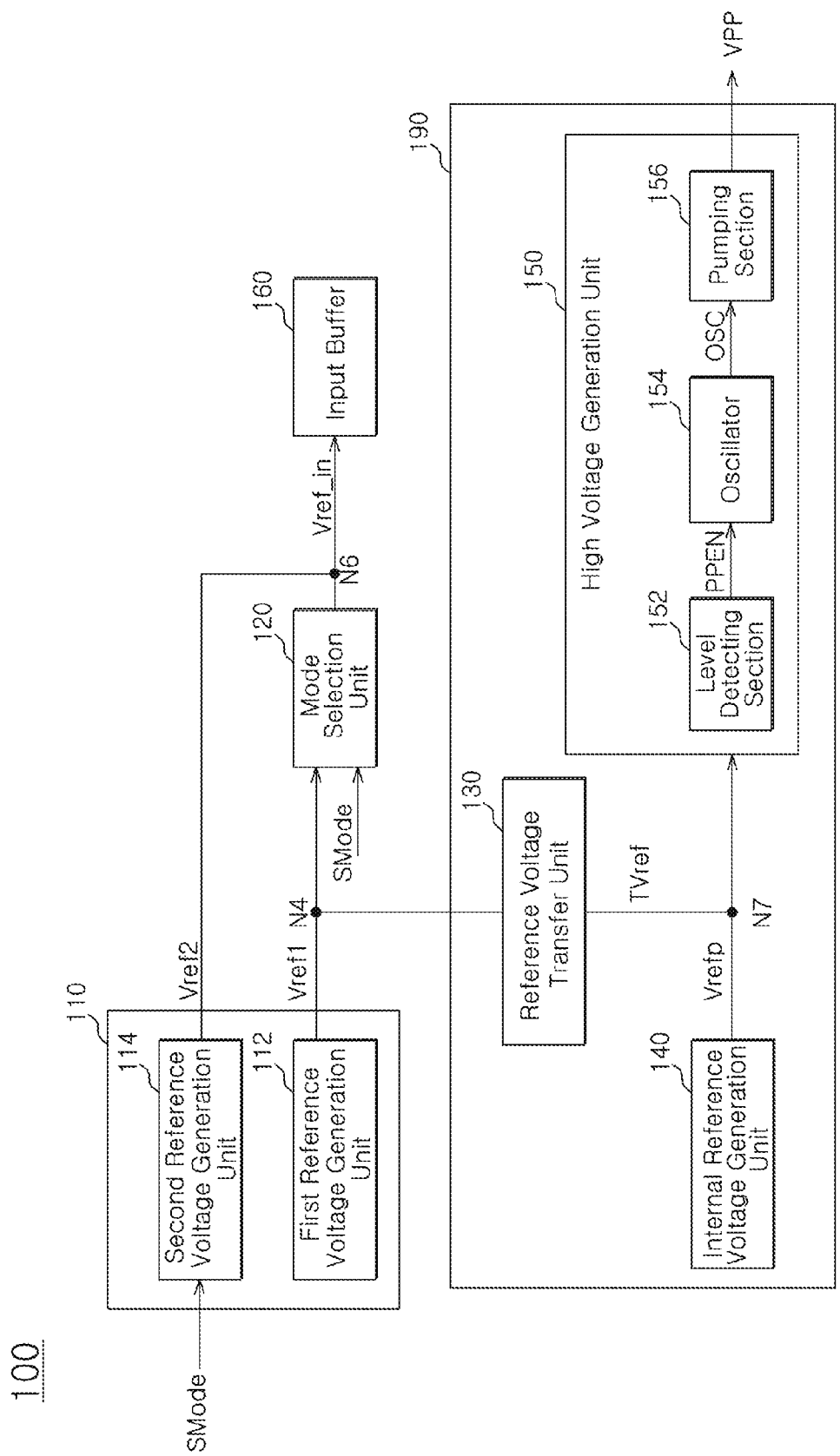
FIG. 1 is a block diagram illustrating a semiconductor integrated circuit in accordance with an embodiment of the present invention.

Reference will now be made in detail to the exemplary embodiments consistent with the present disclosure, examples of which are illustrated in the accompanying drawings. Wherever possible, the same reference characters will be used throughout the drawings to refer to the same or like parts.

FIG. 1 is a block diagram illustrating a semiconductor integrated circuit in accordance with an embodiment of the present invention.

Referring to FIG. 1, a semiconductor integrated circuit 100 in accordance with the embodiment includes a reference voltage generation block 110, a mode selection unit 120, an input buffer 160, and an internal voltage generation block 190.

The reference voltage generation block 110 is configured to generate reference voltages Vref1 and Vref2 each of which is to be applied to the input buffer 160 in a normal mode and a package test mode, respectively, and includes first and second reference voltage generation units 112 and 114.

The first reference voltage generation unit 112 is configured to generate the first reference voltage Vref1 and apply the first reference voltage Vref1 both to the mode selection unit 120 and to a reference voltage transfer unit 130 of the internal voltage generation block 190. The first reference voltage Vref1 is supplied to the input buffer 160 through the mode selection unit 120 in the normal mode. The first reference voltage Vref1 is supplied to the reference voltage transfer unit 130 in the package test mode and is used to monitor and force an internal power potential.

Since the first reference voltage Vref1 is not supplied to the input buffer 160 through the mode selection unit 120 in the package test mode, the present invention needs the second reference voltage generation unit 114 for providing a reference voltage to be applied to the input buffer 160.

Accordingly, the second reference voltage generation unit 114 of the present invention is configured to generate the second reference voltage Vref2 in place of the first reference voltage generation unit 112 in the package test mode, and supply the second reference voltage Vref2 to the input buffer 160.

The mode selection unit 120 is configured to provide different reference voltages in the normal mode and the package test mode in response to a mode select signal SMode which is inputted from outside.

In particular, the mode selection unit 120 is deactivated and prevents the first reference voltage Vref1 from being inputted thereto when the mode select signal SMode having a first level is inputted, and outputs the first reference voltage Vref1, applied from the first reference voltage generation unit 112, to the input buffer 160 when the mode select signal SMode having a second level is inputted from outside.

The input buffer 160 is configured to receive the first reference voltage Vref1 in the normal mode and the second reference voltage Vref2 in the package test mode, and serves to convert the TTL (transistor-transistor logic) level of an external signal into a CMOS level.

The internal voltage generation block 190 is configured to monitor and force the internal power potential in the package test mode, and includes the reference voltage transfer unit 130, an internal reference voltage generation unit 140, and a high voltage generation unit 150.

The reference voltage transfer unit 130 is configured to receive the first reference voltage Vref1 applied from the first reference voltage generation unit 112 and monitor or force the internal power potential through a node N7 as an internal voltage terminal. While a power potential may be variously designed as the reference voltage of a core voltage as the potential of a memory cell, the reference voltage of a negative voltage generation circuit for a back bias, and the reference voltage of a high voltage for driving a word line, and so on, in the embodiment of the present invention, for the sake of convenience in explanation, the power potential will be exemplified as the reference voltage of the high voltage, and the reference voltage of the high voltage will be referred to as an internal reference voltage Vrefp.

The reference voltage transfer unit 130 generates the first reference voltage Vref1, which is inputted using an external driving voltage VDD as an operation voltage, as a test reference voltage TVref, and outputs the generated test reference voltage TVref to the node N7 as the internal voltage terminal. The reference voltage transfer unit 130 outputs the test reference voltage TVref which is generated in response to the level of the mode select signal SMode applied from outside.

In this way, the reference voltage transfer unit 130 may set the first reference voltage Vref1 as a new test reference voltage TVref based on the operation of the external driving voltage VDD. Accordingly, in the present embodiment, even when the first reference voltage Vref1 is applied earlier than the external driving voltage VDD in a package test or the loading of the first reference voltage Vref1 is completed earlier than the loading of the external driving voltage VDD in a power-up sequence, because the first reference voltage Vref1 is generated as a new test reference voltage TVref based on the operation of the external driving voltage VDD through the reference voltage transfer unit 130, the reliability of a chip may be improved.

The internal reference voltage generation unit 140 is configured to generate the internal reference voltage Vrefp using the external driving voltage VDD inputted from outside. The internal reference voltage generation unit 140 is activated only in the package test mode.

The high voltage generation unit 150 is configured to pump the internal reference voltage Vrefp or the first reference voltage Vref1 which is applied to the node N7, and generate a high voltage VPP having a specified level.

The high voltage generation unit 150 includes a level detecting section 152 which is configured to detect the level of the internal reference voltage Vrefp and output a level signal PPEN, an oscillator 154 which is configured to generate a periodic signal OSC oscillating with a preset cycle, in response to the level signal PPEN, and a pumping section 156 which is configured to charge-pump the external driving voltage VDD during the activation interval of the periodic signal OSC and output the high voltage VPP.

Figure 2:
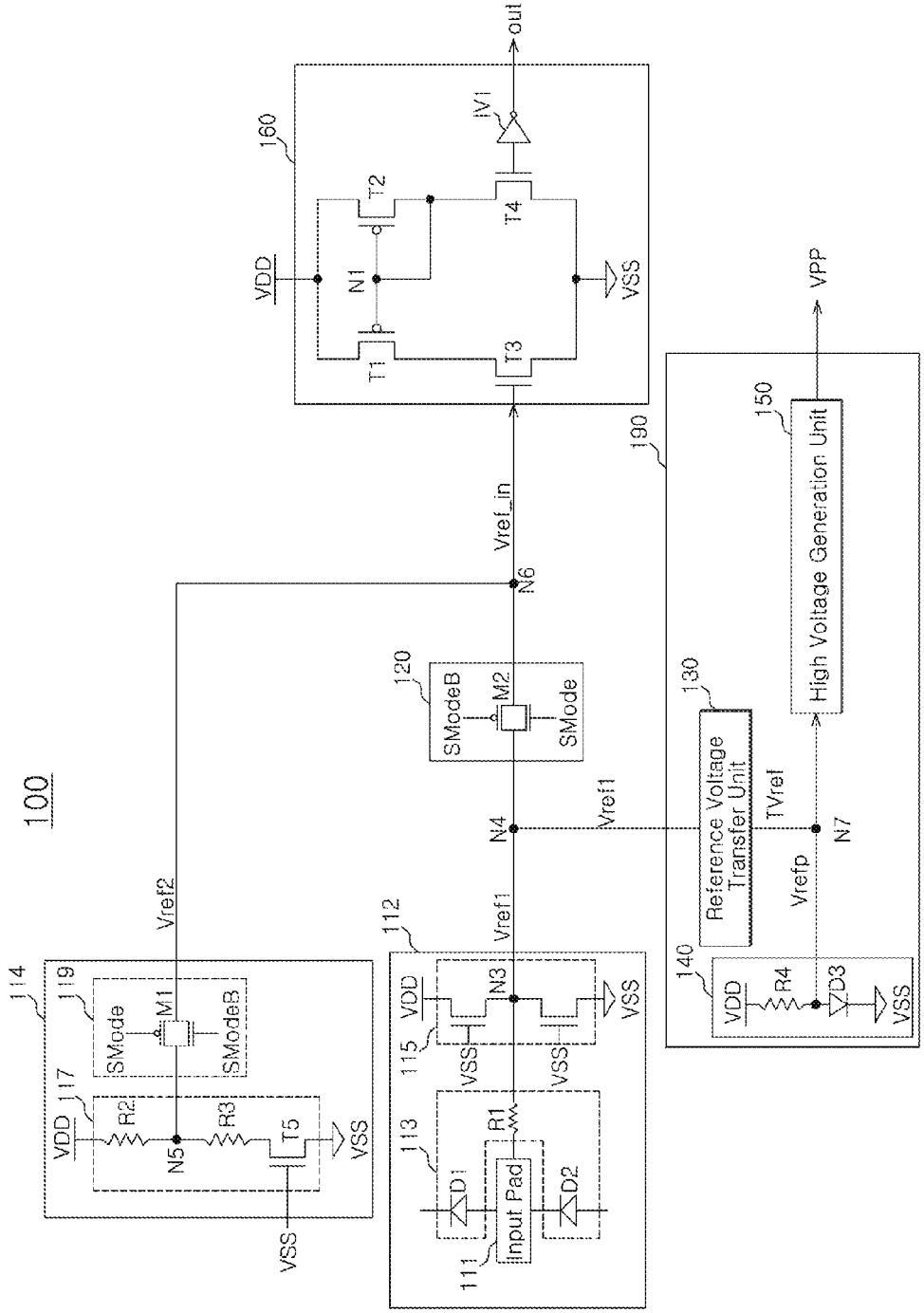
FIG. 2 is a detailed circuit diagram of the semiconductor integrated circuit in accordance with the embodiment of the present invention.

FIG. 2 is a detailed circuit diagram of the semiconductor integrated circuit shown in FIG. 1 in accordance with the embodiment of the present invention.

Referring to FIG. 2, the semiconductor integrated circuit 100 in accordance with the embodiment of the present invention includes the first and second reference voltage generation units 112 and 114, the mode selection unit 120, the input buffer 160, and the internal voltage generation block 190.

The first reference voltage generation unit 112 generates the first reference voltage Vref1. The first reference voltage generation unit 112 includes an input pad 111 which is coupled with an external bonding, an electrostatic protecting section 113 which is configured to protect the input pad 111 from noise, and a first generating section 115 which is configured to generate the first reference voltage Vref1 using the external driving voltage VDD and a ground voltage VSS. The electrostatic protecting section 113 includes first and second diodes D1 and D2 which are respectively connected with one terminal and another terminal of the input pad 111 and a resistor R1 which is coupled between another terminal of the input pad 111 and the first generating section 115.

The second reference voltage generation unit 114 includes a second generating section 117 which is configured to distribute the external driving voltage VDD applied from outside to second and third resistors R2 and R3 coupled in series and generate the second reference voltage Vref2, and a switching section 119 which is electrically connected with the second generating section 117 through a fifth node N5 and is configured to switch the second reference voltage Vref2 in response to the level of the mode select signal SMode applied from outside.

The switching section 119 is activated and outputs the second reference voltage Vref2 to the input buffer 160 when the inputted mode select signal SMode has the first level, and is deactivated and prevents the second reference voltage Vref2 from being outputted to the input buffer 160 when the mode select signal SMode has the second level.

Here, the first level means a low level and the second level means a high level. The first and second levels are not limited to the respective low and high levels as in the present embodiment of the invention, and may be changed as the occasion demands.

The mode selection unit 120 outputs the first reference voltage Vref1 in response to the level of the inputted mode select signal SMode.

In particular, the mode selection unit 120 is deactivated and prevents the first reference voltage Vref1 from being inputted to the input buffer 160 when the inputted mode select signal SMode has the first level, and is activated and outputs the first reference voltage Vref1 to the input buffer 160 when the mode select signal SMode has the second level.

The mode selection unit 120 is activated in case the semiconductor integrated circuit is in the normal mode, whereas the mode selection unit 120 is deactivated in case the semiconductor integrated circuit is in the package test mode.

The input buffer 160 receives any one of the first and second reference voltages Vref1 and Vref2 and functions to convert the TTL level of the external signal into the CMOS level. The input buffer 160 may comprise a differential amplifier. While the input buffer 160 shown in FIG. 2 is designed as a differential amplifier which includes PMOS transistors T1 and T2 coupled in a current mirror type, the present invention is not limited to such a design, and the input buffer 160 may be designed as a differential amplifier (not shown) which includes resistors.

The internal voltage generation block 190 monitors and forces the internal potential in the package test mode, and includes the reference voltage transfer unit 130, the internal reference voltage generation unit 140, and the high voltage generation unit 150.

The reference voltage transfer unit 130 outputs the first reference voltage Vref1 applied from the first reference voltage generation unit 112, to the node N7 as the internal voltage terminal. The reference voltage transfer unit 130 according to the invention will be described later in further detail with reference to FIGS. 3 through 5.

The internal reference voltage generation unit 140 generates the internal reference voltage Vrefp using the external driving voltage VDD inputted from outside. The internal reference voltage generation unit 140 includes a resistor R4 and a diode D3 which are disposed between the external driving voltage VDD and the ground voltage VSS.

The high voltage generation unit 150 pumps the internal reference voltage Vrefp applied from the internal reference voltage generation unit 140 or the first reference voltage Vref1 applied from the reference voltage transfer unit 130, and generates the high voltage VPP having the specified level.

Figure 3:
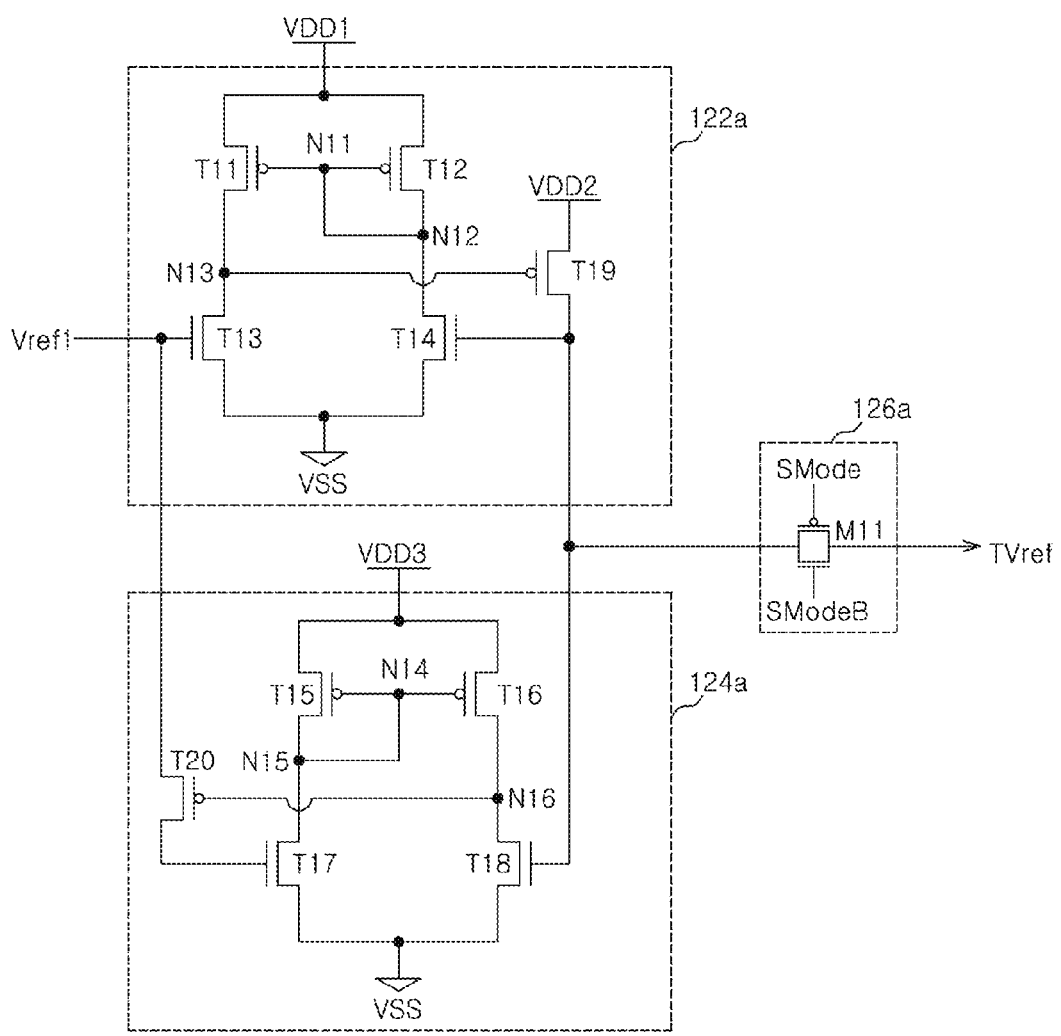
FIG. 3 is a detailed circuit diagram of one embodiment of the reference voltage transfer unit of the semiconductor integrated circuit shown in FIG. 2.

FIG. 3 is a detailed circuit diagram of one embodiment of the reference voltage transfer unit of the semiconductor integrated circuit shown in FIG. 2.

Referring to FIG. 3, one embodiment of the reference voltage transfer unit 130 outputs a first reference voltage according to the operational power of an internal voltage, and includes a first buffer 122a section 122a, a second buffer section 124a and a transfer section 126a.

The first buffer section 122a is configured to compare the level of the inputted first reference voltage Vref1 with a first external driving voltage VDD1, and output the first reference voltage Vref1 according to the operational power of a second external driving voltage VDD2 as a result of the comparison. The first buffer section 122a may be designed as a differential amplifier which includes PMOS transistors T11 and T12 coupled in a current mirror type.

For example, the second buffer section 124a is configured to compare the level of the inputted first reference voltage Vref1 with a third external driving voltage VDD3, and prevents the inputted first reference voltage Vref1 from being outputted to the node N7 as the internal voltage terminal as a result of the comparison. The second buffer section 124a may be designed as a differential amplifier which includes PMOS transistors T15 and T16 coupled in a current mirror type.

The transfer section 126a is activated and outputs the first reference voltage Vref1 to the node N7 as the internal voltage terminal when the mode select signal SMode has the first level such that the internal power potential may be monitored and forced, and is deactivated and prevents the first reference voltage Vref1 from being outputted when the mode select signal SMode has the second level. In an embodiment of the present invention, the transfer section 126a may be designed as a transmission gate M11.

As a consequence, even when the first reference voltage Vref1 is applied earlier than the external driving voltages VDD1, VDD2 and VDD3, the reference voltage transfer unit 130 according to the embodiment of the present invention activates the first reference voltage Vref1 in response to the level of the mode select signal SMode and outputs the first reference voltage Vref1 in response to the operational power of the external driving voltages VDD1, VDD2 and VDD3.

That is to say, in the embodiment of the present invention, even when the first reference voltage Vref1 is applied earlier than the external driving voltages VDD1, VDD2 and VDD3 in a package test, or even when the loading of the first reference voltage Vref1 is completed earlier than the loading of the external driving voltages VDD1, VDD2 and VDD3 in a power-up sequence, because the first reference voltage Vref1 is outputted to the node N7 according to the operational power of the external driving voltages VDD1, VDD2 and VDD3 through the reference voltage transfer unit 130, the high voltage VPP is prevented from increasing over a predetermined value depending upon the external driving voltage VDD.

Figure 4:
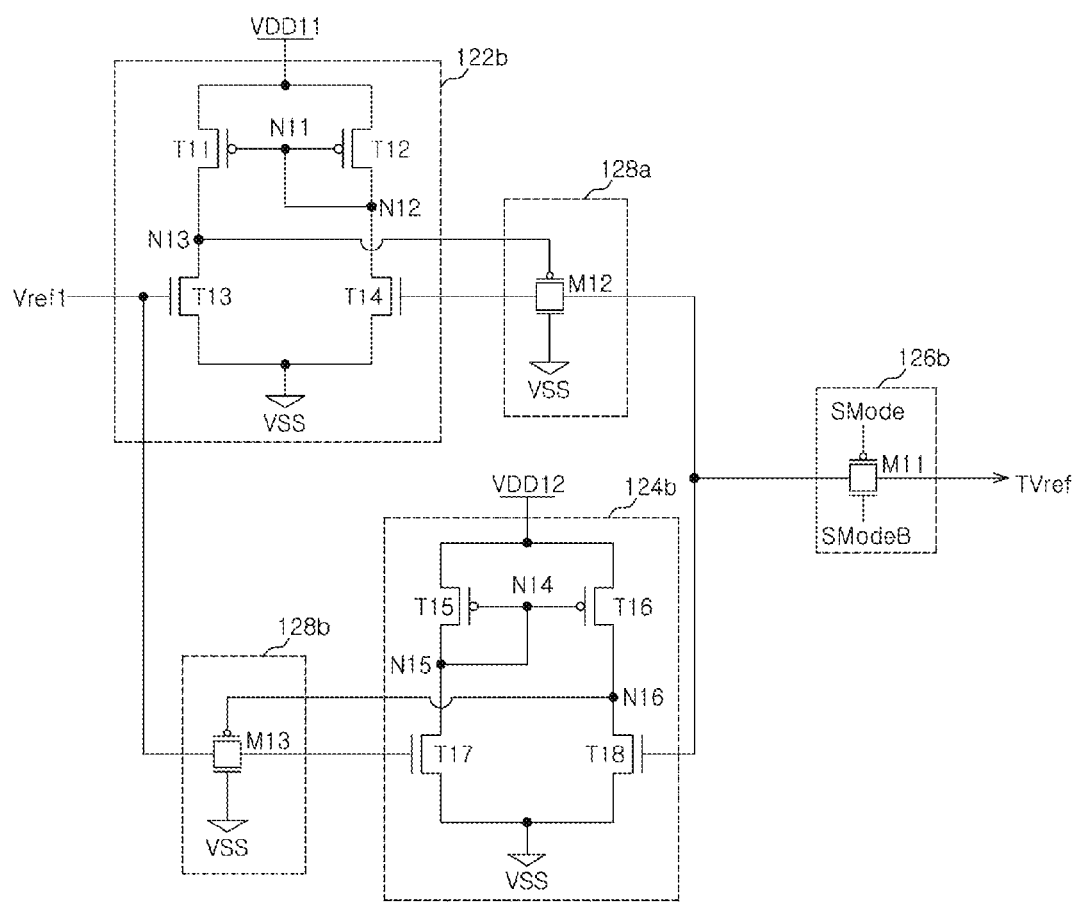
FIG. 4 is a detailed circuit diagram of another embodiment of the reference voltage transfer unit of the semiconductor integrated circuit shown in FIG. 2.

FIG. 4 is a detailed circuit diagram of another embodiment of the reference voltage transfer unit of the semiconductor integrated circuit shown in FIG. 2.

Referring to FIG. 4, another embodiment of the reference voltage transfer unit 130 outputs a first reference voltage according to the operational power of an internal voltage, and includes a first buffer section 122b, a second buffer section 124b, a first selecting section 128a, a second selecting section 128b, and a transfer section 126b. Since the first buffer section 122b, the second buffer section 124b and the transfer section 126b shown in FIG. 4 are the same as the first buffer section 122a, the second buffer section 124a and the transfer section 126a shown in FIG. 3, description of their configurations will be omitted here, and only the first and second selecting sections 128a and 128b will be described below.

The first selecting section 128a is open when a node N13 has a low level, such that the first reference voltage Vref1 is outputted to the node N7. The first selecting section 128a includes a transmission gate M12.

The second selecting section 128b is closed when a node N16 has a high level, such that the first reference voltage Vref1 is not outputted to the node N7. In the embodiment of the present invention, when the first reference voltage Vref1 is not outputted to the node N7 by the second selecting section 128b, the internal reference voltage Vrefp generated in the internal reference voltage generation unit 140 is outputted to the high voltage generation unit 150 so that the high voltage VPP may be generated. The second selecting section 128b includes a transmission gate M13.

In this way, in the embodiment of the present invention, even when the first reference voltage Vref1 is applied earlier than external driving voltages VDD1, VDD2 and VDD3, because the reference voltage transfer unit 130 outputs the first reference voltage Vref1 to the node N7 according to the operational power of the external driving voltages VDD1, VDD2 and VDD3, it is possible to prevent the high voltage VPP from increasing over a predetermined value.

Figure 5:
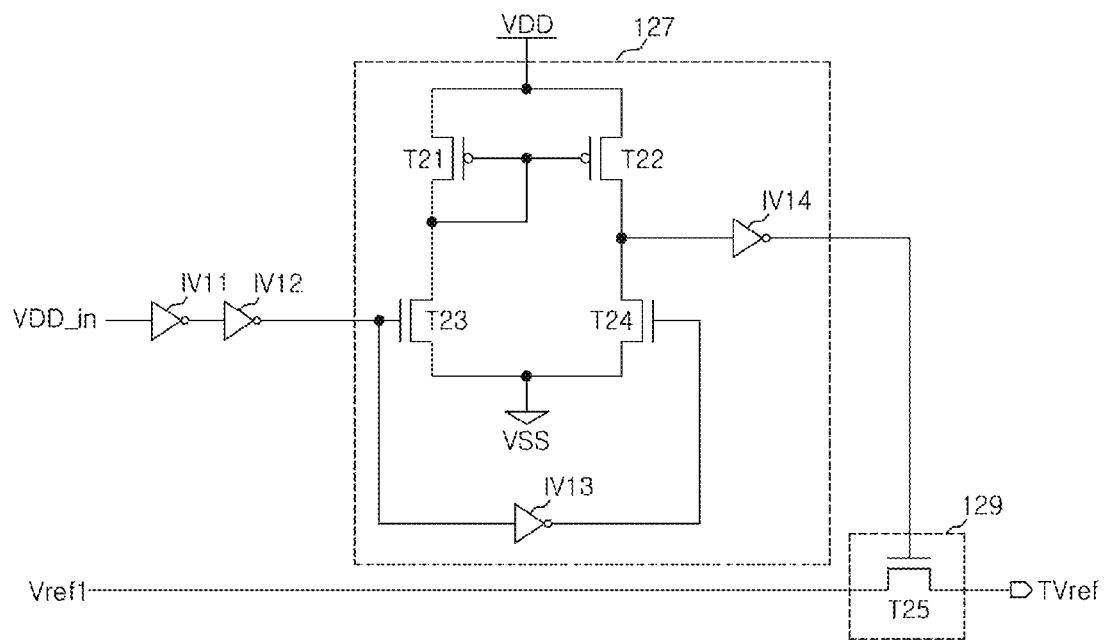
FIG. 5 is a detailed circuit diagram of another embodiment of the reference voltage transfer unit of the semiconductor integrated circuit shown in FIG. 2.

FIG. 5 is a detailed circuit diagram of another embodiment of the reference voltage transfer unit of the semiconductor integrated circuit shown in FIG. 2.

Referring to FIG. 5, another embodiment of the reference voltage transfer unit 130 includes a reference voltage buffer section 127 and a voltage transfer section 129.

The reference voltage buffer section 127 is configured to compare the levels of a reference driving voltage VDD_in and an external driving voltage VDD, and output the reference driving voltage VDD_in to the voltage transfer section 129 as a driving voltage only when the reference driving voltage VDD_in has a high level.

The voltage transfer section 129 is configured to generate the first reference voltage Vref1 as a test reference voltage TVref and output the test reference voltage TVref to the node N7 to be forced, only when the reference driving voltage VDD_in has the high level. In the embodiment of the present invention, the voltage transfer section 129 may be designed as an NMOS transistor T25.

In this way, in the embodiment of the present invention, even when the first reference voltage Vref1 is applied earlier than external driving voltages, because the reference voltage transfer unit 130 generates and outputs the first reference voltage Vref1 as the new test reference voltage TVref, it is possible to prevent the high voltage VPP from increasing over a predetermined value.

Figure 6:
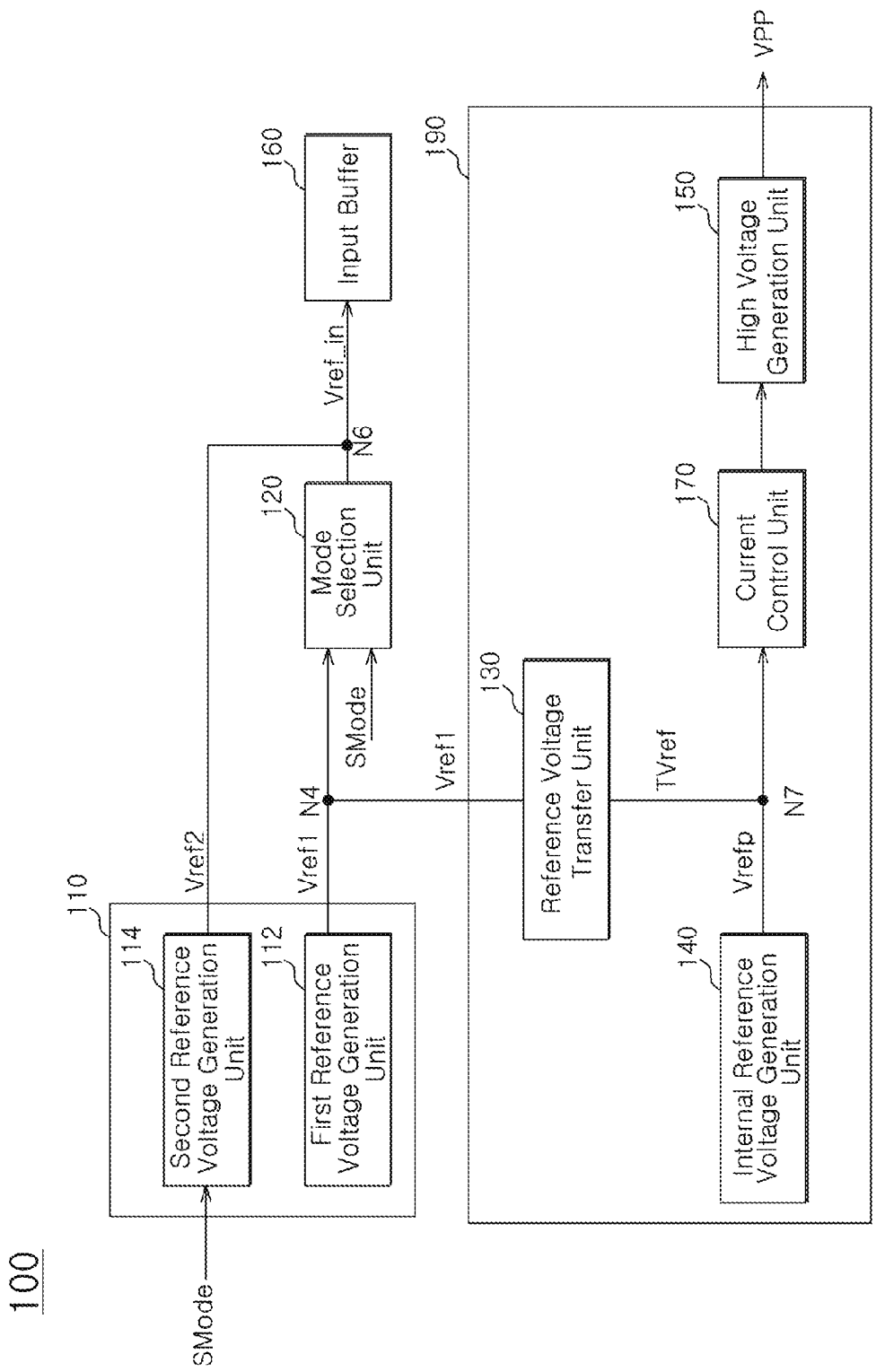
FIG. 6 is a block diagram illustrating a semiconductor integrated circuit in accordance with another embodiment of the present invention.

FIG. 6 is a block diagram illustrating a semiconductor integrated circuit in accordance with another embodiment of the present invention.

Referring to FIG. 6, a semiconductor integrated circuit 100 in accordance with another embodiment of the present invention includes the configuration of the semiconductor integrated circuit in accordance with the embodiment of the present invention shown in FIG. 1, and additionally includes a current control unit 170 for controlling the current of an applied first reference voltage.

When an external driving voltage VDD does not reach a predetermined level, that is, when a first reference voltage Vref1 is applied to a node N7 earlier than the external driving voltage VDD, the current control unit 170 may allow current to flow to the ground voltage VSS such that the first reference voltage Vref1 may be applied after the application of the external driving voltage VDD and the high voltage VPP may be forced to a desired level.

Figure 7:
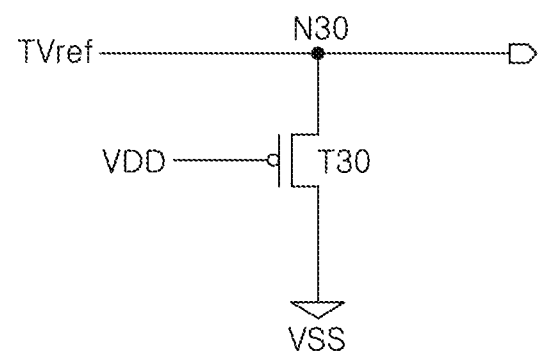
FIG. 7 is a detailed circuit diagram illustrating the current control unit shown in FIG. 6.

Referring to FIG. 7, the current control unit 170 includes a PMOS transistor T30. The external driving voltage VDD is applied to the gate terminal of the PMOS transistor T30, and the drain terminal of the PMOS transistor T30 is coupled between an internal reference voltage generation unit 140 and a high voltage generation unit 150 through a node N30 as an internal voltage terminal.

Figure 8:
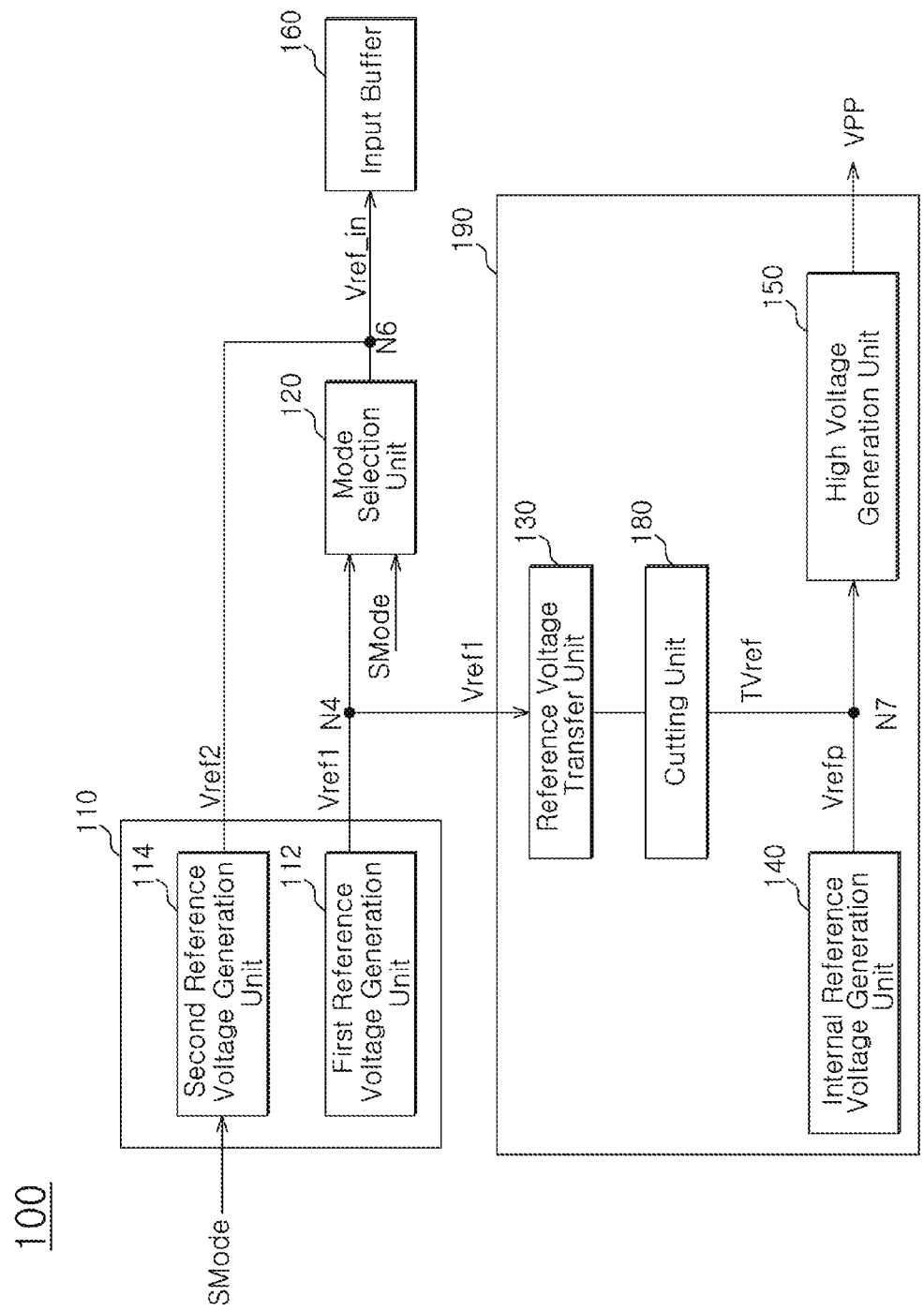
FIG. 8 is a block diagram illustrating a semiconductor integrated circuit in accordance with another embodiment of the present invention.

FIG. 8 is a block diagram illustrating a semiconductor integrated circuit in accordance with another embodiment of the present invention.

Referring to FIG. 8, a semiconductor integrated circuit 100 in accordance with another embodiment of the present invention includes the configuration of the semiconductor integrated circuit in accordance with the embodiment of the present invention shown in FIG. 1, and additionally includes a cutting unit 180 which is cut after a package test mode is finished. The cutting unit 180 may be formed as a fuse (not shown).

While a reference voltage transfer unit 130, an internal reference voltage generation unit 140 and a high voltage generation unit 150 according to the embodiment of the present invention are needed in a package test mode to figure out the internal characteristics of a chip and conduct a failure analysis verification, they are not needed in mass production. Therefore, as the cutting unit 180 is added as in the embodiment of the present invention, it is possible to prevent the reliability of the chip from being degraded due to the presence of unnecessary component parts.

While certain embodiments have been described above with reference to illustrative embodiments for particular applications, it should be understood that the embodiments described are by way of example only. Those skilled in the art with access to the teachings provided in this disclosure will recognize additional modifications, applications, and/or embodiments and additional fields in which the present disclosure would be of significant utility. Accordingly, the disclosed data output circuit of a semiconductor memory described herein should not be limited to the described embodiments. Rather, they should only be limited in light of the claims that follow when taken in conjunction with the above description and accompanying drawings.

What is claimed is:

1. A semiconductor integrated circuit which operates in a package test mode and a normal operation mode, the semiconductor integrate circuit comprising:
    an internal reference voltage generation unit configured to generate an internal reference voltage and output the internal reference voltage to a node;
    a high voltage generation unit configured to pump an external driving voltage based on a voltage applied from the node, and generate a high voltage having a specified level by performing a pumping operation in the package test mode and the normal operation mode; and
    a reference voltage transfer unit configured to receive a reference voltage, generate a test reference voltage based on the reference voltage to correspond to a change in a driving operation of the external driving voltage applied from outside, and monitor a voltage level of the node in the package test mode,
    wherein the reference voltage transfer unit comprises:
    a first buffer section configured to compare the reference voltage generated from the reference voltage generation unit with a first driving voltage when the reference voltage is inputted at a first level, and activate the test reference voltage outputted as a result of comparison, according to a change in a driving operation of a second driving voltage;
    a second buffer section configured to compare the reference voltage generated from the reference voltage generation unit with the second driving voltage when the reference voltage is inputted at a second level, and deactivate the test reference voltage outputted as a result of comparison; and
    a transfer section configured to output the test reference voltage to the node which is formed between the internal reference voltage generation unit and the high voltage generation unit, in response to a mode select signal applied from outside.

2. The semiconductor integrated circuit according to claim 1, further comprising:
    a reference voltage generation unit configured to generate the reference voltage that is received to the reference voltage transfer unit.

3. The semiconductor integrated circuit according to claim 2, wherein the reference voltage transfer unit further comprises:
    a first selecting section configured to activate the reference voltage generated from the reference voltage generation unit during forcing and output the reference voltage generated from the reference voltage generation unit as the test reference voltage to the node; and a second selecting section configured to deactivate the reference voltage generated from the reference voltage generation unit during monitoring and output the internal reference voltage to the node.

4. The semiconductor integrated circuit according to claim 2, wherein the reference voltage transfer unit comprises:
a reference voltage buffer section configured to compare levels of a reference driving voltage and the external driving voltage, and output the reference driving voltage in correspondence to a level of the reference driving voltage; and
a voltage transfer section configured to output the reference voltage generated from the reference voltage generation unit as the test reference voltage to the node which is formed between the internal reference voltage generation unit and the high voltage generation unit, when the reference driving voltage has a high level.

5. The semiconductor integrated circuit according to claim 2, further comprising:
a current control unit configured to control current of the reference voltage generated from the reference voltage generation unit.

6. The semiconductor integrated circuit according to claim 2, wherein the reference voltage transfer unit is configured to force the test reference voltage at the node or monitor the voltage level of the node by using the input pad.

7. A semiconductor integrated circuit comprising:
a reference voltage generation unit configured to generate first and second reference voltages;
a mode selection unit configured to activate the first reference voltage in response to a level of a mode select signal applied from outside; and
an internal voltage generation block configured to generate a test reference voltage from the first reference voltage in correspondence to a change in a driving operation of an external driving voltage applied from outside in a package test mode, force the test reference voltage at a node, and generate a high voltage based on the voltage level of the node,
wherein the internal voltage generation block comprises:
an internal reference voltage generation unit configured to generate the internal reference voltage;
a high voltage generation unit configured to pump the external driving voltage based on the internal reference voltage applied from the internal reference voltage generation unit, and generate the high voltage having a specified level; and
a reference voltage transfer unit configured to generate the test reference voltage from the first reference voltage to correspond to the change in the driving operation of the external driving voltage applied from outside, and output the test reference voltage to the node which is formed between the internal reference voltage generation unit and the high voltage generation unit,
wherein the reference voltage transfer unit comprises:
a first buffer section configured to compare the reference voltage with a first driving voltage when the reference voltage is inputted at a first level, and activate the test reference voltage outputted as a result of comparison, according to a change in a driving operation of a second driving voltage;
a second buffer section configured to compare the reference voltage with the second driving voltage when the reference voltage is inputted at a second level, and deactivate the test reference voltage outputted as a result of comparison; and
a transfer section configured to output the test reference voltage to a node which is formed between the internal reference voltage generation unit and the high voltage generation unit, in response to a mode select signal applied from outside.

8. The semiconductor integrated circuit according to claim 7, further comprising:
an input buffer configured to receive the first reference voltage in a normal mode and the second reference voltage in the package test mode.

9. The semiconductor integrated circuit according to claim 8, wherein the reference voltage transfer unit further comprises:
a first selecting section configured to activate the reference voltage during forcing and output the reference voltage to the node; and
a second selecting section configured to deactivate the reference voltage during monitoring and output the internal reference voltage to the high voltage generation unit.

10. The semiconductor integrated circuit according to claim 8, wherein the reference voltage transfer unit comprises:
a reference voltage buffer section configured to compare levels of a reference driving voltage and the external driving voltage, and output the reference driving voltage in correspondence to a level of the reference driving voltage; and
a voltage transfer section configured to output the reference voltage to a node which is formed between the internal reference voltage generation unit and the high voltage generation unit, when the reference driving voltage has a high level.

11. The semiconductor integrated circuit according to claim 8, wherein the internal voltage generation block is configured to force the test reference voltage at the node or monitor the voltage level of the node by using an input pad.

* * * * *